United States Patent
Zhao

(10) Patent No.: US 9,903,650 B2
(45) Date of Patent: Feb. 27, 2018

(54) SUBSTRATE SUPPORT STRUCTURE, VACUUM DRYING DEVICE AND VACUUM DRYING METHOD

(71) Applicant: BOE TECHNOLOGY GROUP CO., LTD., Beijing (CN)

(72) Inventor: Dejiang Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/147,321

(22) Filed: May 5, 2016

(65) Prior Publication Data

US 2017/0051977 A1   Feb. 23, 2017

(30) Foreign Application Priority Data

Aug. 21, 2015   (CN) .......................... 2015 1 0518683

(51) Int. Cl.
| | |
|---|---|
| *F26B 25/00* | (2006.01) |
| *H01L 21/687* | (2006.01) |
| *F26B 5/12* | (2006.01) |
| *H01L 21/67* | (2006.01) |
| *F26B 5/06* | (2006.01) |

(52) U.S. Cl.
CPC .............. *F26B 25/004* (2013.01); *F26B 5/06* (2013.01); *F26B 5/12* (2013.01); *H01L 21/67034* (2013.01); *H01L 21/6875* (2013.01); *H01L 21/68742* (2013.01)

(58) Field of Classification Search
CPC .. F26B 5/06; F26B 5/12; F26B 25/004; H01L 21/68742; H01L 21/6875

USPC ....................................................... 34/406, 78
See application file for complete search history.

(56) References Cited

U.S. PATENT DOCUMENTS

| | | | | |
|---|---|---|---|---|
| 5,625,526 A | * | 4/1997 | Watanabe | ............... G03F 7/707 |
| | | | | 361/234 |
| 5,775,000 A | * | 7/1998 | Maekawa | ......... H01L 21/68728 |
| | | | | 134/902 |
| 5,829,156 A | * | 11/1998 | Shibasaki | ......... H01L 21/67034 |
| | | | | 34/58 |
| 6,435,798 B1 | * | 8/2002 | Satoh | .................. C23C 16/4586 |
| | | | | 118/728 |

(Continued)

FOREIGN PATENT DOCUMENTS

| | | |
|---|---|---|
| CN | 101010147 A | 8/2007 |
| CN | 102085511 A | 6/2011 |

(Continued)

OTHER PUBLICATIONS

First Office Action regarding Chinese Application No. 201510518683.4, dated Jan. 12, 2017. Translation provided by Dragon Intellectual Property Law Firm.

*Primary Examiner* — Stephen M Gravini
(74) *Attorney, Agent, or Firm* — Harness, Dickey & Pierce, P.L.C.

(57) ABSTRACT

The present disclosure provides a substrate support structure, a vacuum drying device and a vacuum drying method. The substrate support structure includes a support platform and a plurality of pins in the support platform. The plurality of pins is divided into at least two groups, and the at least two groups of pins are in the support platform in such a manner as to be liftable in the support platform, so that a substrate is supported by the at least two groups of pins alternately.

20 Claims, 3 Drawing Sheets

(56) References Cited

U.S. PATENT DOCUMENTS

| | | | | |
|---|---|---|---|---|
| 7,797,855 B2* | 9/2010 | Fukuoka | ............... | C30B 33/02 |
| | | | | 118/709 |
| 7,871,470 B2* | 1/2011 | Schieve | ............. | C23C 16/4582 |
| | | | | 118/728 |
| 8,603,249 B2* | 12/2013 | Kim | ..................... | G02F 1/1303 |
| | | | | 118/715 |
| 8,635,784 B2* | 1/2014 | Ettinger | ........... | H01L 21/67034 |
| | | | | 271/267 |
| 9,236,283 B2* | 1/2016 | Sahoda | ............ | H01L 21/67109 |
| 2017/0004982 A1* | 1/2017 | Sundararajan | .... | H01L 21/68785 |
| 2017/0051977 A1* | 2/2017 | Zhao | ..................... | F26B 25/004 |
| 2017/0157922 A1* | 6/2017 | Zhao | ..................... | B41J 2/1433 |

FOREIGN PATENT DOCUMENTS

| | | | | |
|---|---|---|---|---|
| CN | 202351589 U | | 7/2012 | |
| CN | 203578136 U | | 5/2014 | |
| GB | 855866 A | * | 12/1960 | ............ A21C 15/00 |
| JP | 2001205165 A | | 7/2001 | |
| JP | 2002045751 A | | 2/2002 | |
| JP | 2009295817 A | | 12/2009 | |
| JP | 6080647 B2 | * | 2/2017 | |
| KR | 20090024056 A | * | 3/2009 | |

* cited by examiner

SUBSTRATE SUPPORT STRUCTURE, VACUUM DRYING DEVICE AND VACUUM DRYING METHOD

CROSS-REFERENCE TO RELATED APPLICATION

The present application claims a priority of the Chinese patent application No. 201510518683.4 filed on Aug. 21, 2015, which is incorporated herein by reference in its entirety.

TECHNICAL FIELD

The present disclosure relates to the field of manufacturing substrates, in particular to a substrate support structure, a vacuum drying device, and a vacuum drying method.

BACKGROUND

During the manufacture of a substrate of a thin film transistor-liquid crystal display (TFT-LCD), a vacuum drying (VCD) process, as an important one, refers to subjecting the substrate coated with a coating liquid such as a photoresist to vacuum drying treatment, so as to solidify the coating liquid.

There are mainly two kinds of VCD devices, one of which needs to be heated and the other of which does not need to be heated. Usually, the former is heated in an atmosphere, and it includes a support platform on which a plurality of pins is provided. During the vacuum drying, the substrate is placed onto the pins. However, obvious Mura may easily occur at positions where the substrate is in contact with the pins.

SUMMARY

An object of the present disclosure is to provide a substrate support structure, a vacuum drying device and a vacuum drying method, so as to prevent the occurrence of defects at positions where a substrate is in contact with pins.

In one aspect, the present disclosure provides in some embodiments a substrate support structure, including a support platform and a plurality of pins in the support platform. The plurality of pins is divided into at least two groups, and the at least two groups of pins are in the support platform in such a manner as to be liftable in the support platform, so that a substrate is supported by the at least two groups of pins alternately.

Optionally, a region of the support platform exactly facing the substrate is equally divided into a plurality of sub-regions arranged in a matrix form, and each group of pins includes at least one pin at each sub-region.

Optionally, one of the pins is arranged at a center of each sub-region, and one group of the at least two groups of pins includes the pin arranged at the center of each sub-region.

Optionally, each sub-region is of a rectangular shape, one of the pins is arranged at a center of each side of each sub-region, and the other group of the at least two groups of pins includes the pin arranged at the center of each side of each sub-region.

Optionally, at least one pin is arranged at a border between each sub-region and an adjacent sub-region, and one group of the at least two groups of pins includes the pin arranged at the border between each sub-region and the adjacent sub-region.

Optionally, each sub-region is of a rectangular shape, one of the pins is arranged at at least one corner of each sub-region, and one group of the at least two groups of pins includes the pin arranged at at least one corner of each sub-region.

Optionally, one of the pins is arranged at each corner of each sub-region, and one group of the at least two groups of pins includes the pin arranged at each corner of each sub-region.

Optionally, each sub-region is of a rectangular shape, one of the pins is arranged at at least one corner of each sub-region, one of the pins is arranged at a center of each side of each sub-region, one group of the at least two groups of pins includes the pin arranged at at least one corner of each sub-region, and the other group of the at least two groups of pins includes the pin arranged at the center of each side of each sub-region.

In another aspect, the present disclosure provides in some embodiments a vacuum drying device, including the above-mentioned substrate support structure, and a control mechanism configured to enable at least two groups of pins in the substrate support structure to be lifted alternately so that a substrate is supported by the at least two groups of pins alternately.

Optionally, the control mechanism includes a first control module configured to enable the at least two groups of pins to be lifted alternately at a first frequency within a first time period, and a second control module configured to enable the at least two groups of pins to be lifted alternately at a second frequency less than the first frequency within a second time period subsequent to the first time period.

In yet another aspect, the present disclosure provides in some embodiments a method for vacuum drying a substrate using the above-mentioned vacuum drying device, including steps of placing the substrate on at least two groups of pins, and during a vacuum drying procedure, enabling the at least two groups of pins to be lifted alternately, so as to support the substrate alternately.

Optionally, the step of enabling the at least two groups of pins to be lifted alternately includes enabling the at least two groups of pins to be lifted alternately at a first frequency within a first time period, and enabling the at least two groups of pins to be lifted alternately at a second frequency less than the first frequency within a second time period subsequent to the first time period.

According to the embodiments of the present disclosure, the pins in the support platform are divided into at least two groups, and each group of pins may be lifted in the support platform. In this way, it is able to support the substrate by the at least two groups of pins alternately, thereby to prevent the occurrence of defects in the related art where the pins are in contact with the substrate at fixed positions. In addition, in the case that the substrate is supported by the at least two groups of pins alternately, it is able to prevent the substrate from being curved at a fixed degree for a long period of time, thereby to prevent a coating liquid from being coated unevenly during the vacuum drying process and prevent the occurrence of uneven thickness of the coating liquid.

DETAILED DESCRIPTION OF THE EMBODIMENTS

The present disclosure will be described hereinafter in conjunction with the drawings and embodiments. The following embodiments are for illustrative purposes only, but shall not be used to limit the scope of the present disclosure.

Figure 1:
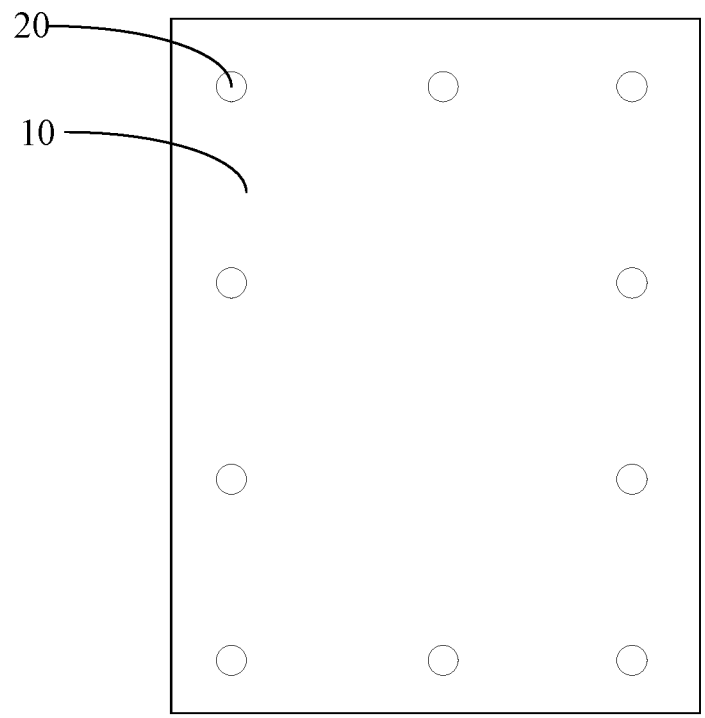
FIG. 1 is a schematic view showing an arrangement of pins for a substrate support structure of a vacuum drying device in the related art.
Figure 2:
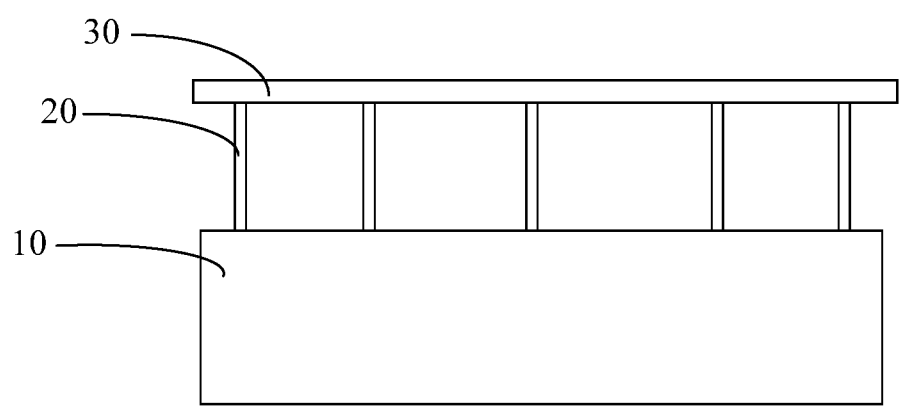
FIG. 2 is a side view of the substrate support structure of the vacuum drying device in the related art.

Referring to FIGS. 1-2, a VCD device in the related art includes a support platform 10 and a plurality of pins 20 arranged on the support platform 10. The pins 20 are fixed onto the support platform 10 in an immobile manner, and as shown in FIGS. 1-2, they are arranged at a peripheral region of the support platform 10 so as to support a periphery of a substrate 30. Because the pins are fixed onto the support platform in an immobile manner, the substrate may be in contact with the pins at fixed positions when the substrate is subjected to vacuum drying treatment. After a coating liquid on the substrate is solidified, obvious Mura may occur at the positions where the substrate is in contact with the pins. In addition, along with the increase in a size of the substrate, the substrate may be curved due to its gravity, and before the coating liquid is completely solidified, the substrate may be curved at a fixed degree for a long period of time. At this time, the coating liquid may flow on the substrate, and as a result, the coating liquid may have different thickness at different regions of the substrate.

In this regard, the present disclosure provides in some embodiments a substrate support structure, so as to prevent the occurrence of the above-mentioned defects at the positions where the substrate is in contact with the pins.

Figure 3:
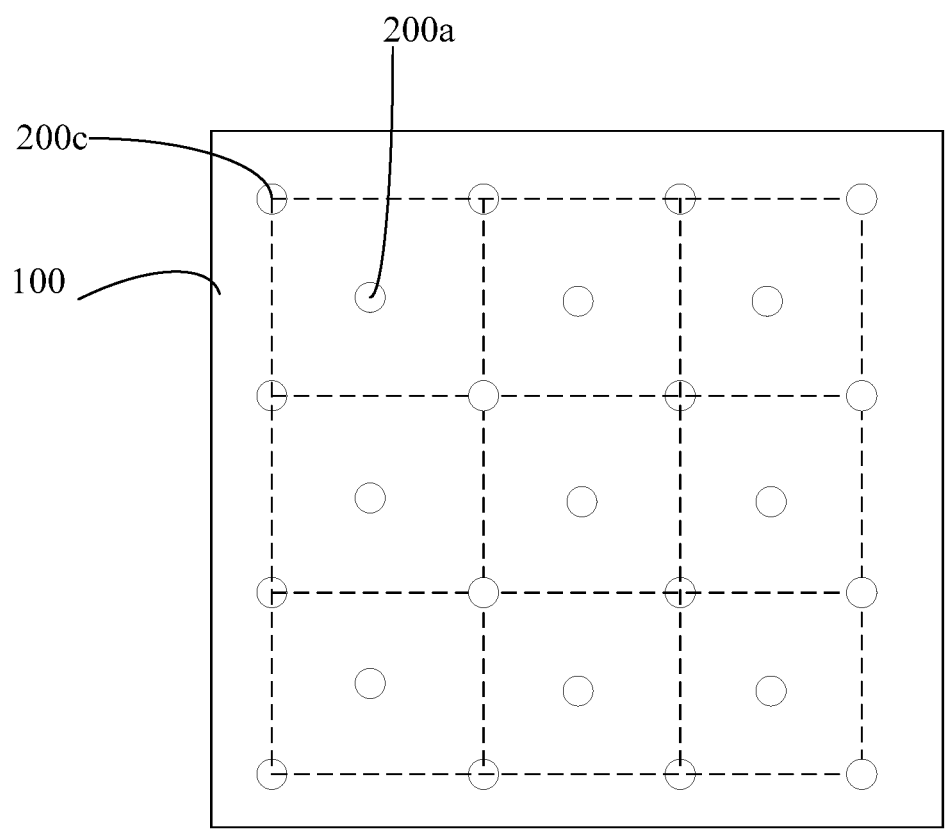
FIG. 3 is a schematic view showing an arrangement of pins for a substrate support structure according to the first embodiment of the present disclosure.
Figure 4:
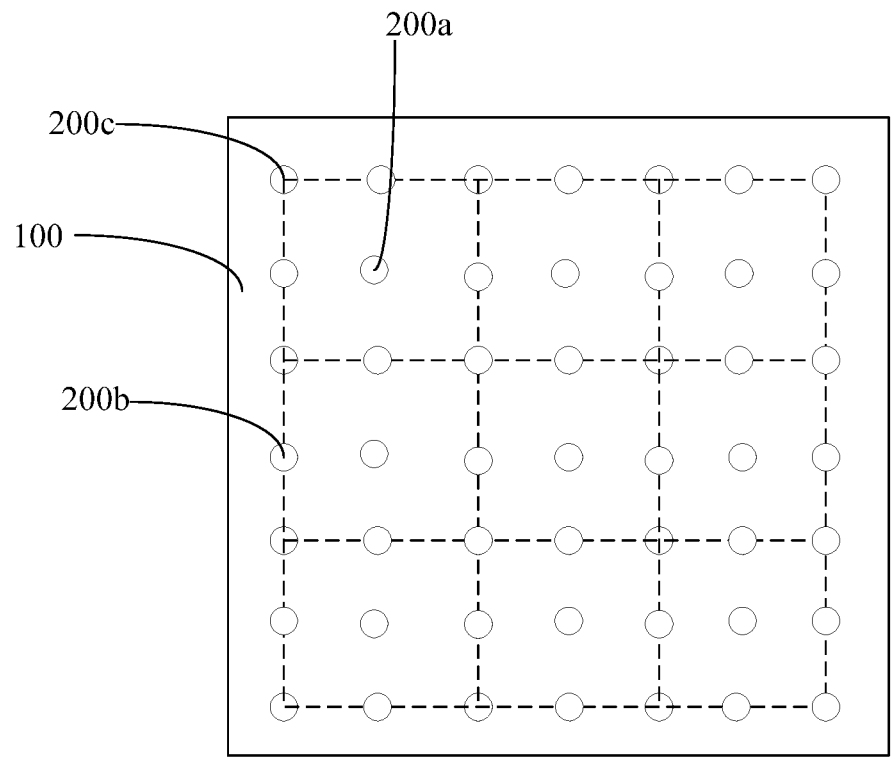
FIG. 4 is another schematic view showing an arrangement of pins for the substrate support structure according to the second embodiment of the present disclosure.
Figure 5:
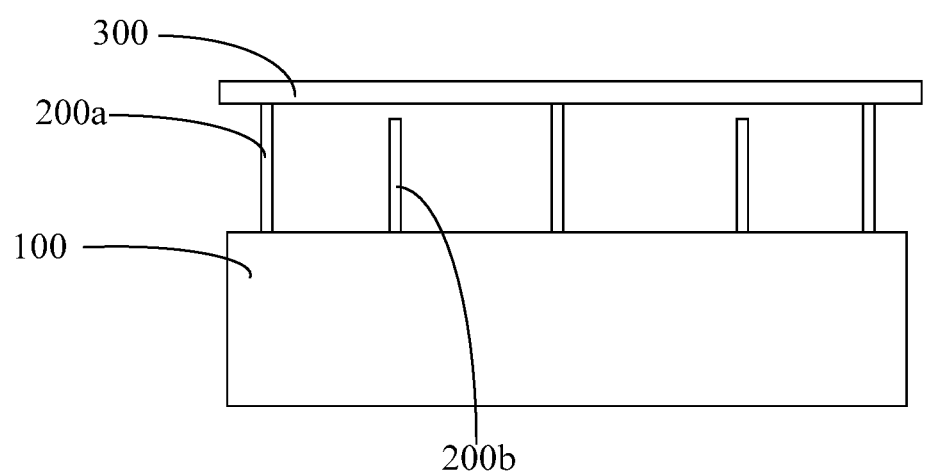
FIG. 5 is a side view of the substrate support structure of a vacuum drying device according to one embodiment of the present disclosure.

As shown in FIGS. 3-5, the substrate support structure in the embodiments of the present disclosure includes a support platform 100 and a plurality of pins arranged on the support platform 100. The plurality of pins is divided into at least two groups, and the at least two groups of pins are arranged on the support platform 100 in such a manner as to be liftable on the support platform 100, so that a substrate is supported by the at least two groups of pins alternately.

According to the embodiments of the present disclosure, the pins on the support platform 100 are divided into at least two groups, and each group of pins may be lifted on the support platform 100, so as to support the substrate alternately. To be specific, in the case that one group of the at least two groups of pins is in contact with the substrate, the other group of the at least two groups of pins is separated from the substrate. During a vacuum drying process, a duration where each group of pins is in contact with the substrate may be set in accordance with the process requirements. In this way, it is able to prevent the occurrence of the defects at the positions where the substrate is in contact with the pins. In addition, in the case that the substrate is supported by the at least two groups of pins alternately, it is able to prevent the substrate from being curved at a fixed degree for a long period of time, thereby to prevent a coating liquid from being coated unevenly during the vacuum drying process and prevent the occurrence of uneven thickness of the coating liquid.

It should be appreciated that, the pins may be lifted on the support platform 100 in various ways. For example, the pin may be lifted through a hydraulic rod. The way for providing the pins on the support platform 100 is not particularly defined herein.

Optionally, as shown in FIGS. 3 and 4, a region of the support platform exactly facing the substrate is equally divided into a plurality of sub-regions arranged in a matrix form, and each group of pins includes at least one pin at each sub-region.

In the case that the pins are arranged on the support platform 100, the region of the support platform 100 corresponding to the substrate to be supported may be divided into a plurality of sub-regions, and each group of pins may include at least one pin at each sub-region. In this way, in the case that the substrate is supported by the at least two groups of pins alternately, each group of pins may separately support the substrate at the positions corresponding to different sub-regions, so as to apply an equal force to the substrate at the positions.

It should be appreciated that, because the substrates with different sizes have different weights, the substrates may be curved at different degrees. In addition, the substrates with different thicknesses may withstand different gravity forces without being deformed, and even in the case of an identical gravity force, the substrates may have different strains. Hence, in the case that the substrate is not significantly deformed, a maximum permissible area of each sub-region mainly depends on a maximum force per unit area that the substrate may withstand. In the case that the area of the sub-region exceeds the maximum permissible area, the significant deformation may occur for the substrate.

Optionally, as shown in FIGS. 3 and 4, the pin 200a is arranged at a center of each sub-region, and one group of the at least two groups of pins includes the pin 200a arranged at the center of each sub-region.

In the embodiments of the present disclosure, one group of the at least two groups of pins includes the pins 200a at the centers of the sub-regions. On one hand, after the region of the support platform has been divided into the sub-regions, it is able to determine the positions for the pins conveniently. On the other hand, in each group, the pins are distributed symmetrically and evenly, so as to apply an equal force to the substrate at the contact positions, thereby to support the substrate in a better manner.

Optionally, as shown in FIG. 4, at least one pin 200b is arranged at a border between each sub-region and an adjacent sub-region, and one group of the at least two groups of pins includes the pin 200b arranged at the border between each sub-region and the adjacent sub-region.

In the embodiments of the present disclosure, one group of the at least two groups of pins includes the pins at the borders between the adjacent sub-regions. On one hand, after the region of the support platform has been divided into the sub-regions, it is able to determine the positions for the pins conveniently. On the other hand, in each group, the pins are distributed evenly, so as to apply an equal force to the substrate at the contact positions, thereby to support the substrate in a better manner.

As shown in FIG. 4, the pin 200b may be arranged at a center of each side of each sub-region. Of course, the pin 200b may be arranged at any other position on the border between the adjacent sub-regions, and the position of the pin 200b is not particularly defined herein.

Optionally, as shown in FIGS. 3 and 4, each sub-region is of a rectangular shape, the pin 200c is arranged at at least one corner of each sub-region, and one group of the at least two groups of pins includes the pin 200c arranged at at least one corner of each sub-region.

In the embodiments of the present disclosure, after the region of the support platform 100 has been divided into the sub-regions, it is able to determine the positions for the pins 200c, so as to support the substrate in a better manner.

Optionally, as shown in FIG. 4, the pins 200c are arranged at the four corners of each sub-region, respectively, and one group of the at least two groups of pins includes the pin 200c arranged at each corner of each sub-region.

The alternative arrangement modes of each group of pins are described hereinabove. FIG. 3 shows the arrangement of the pins according to the first embodiment of the present disclosure, and FIG. 4 shows the arrangement of the pins according to the second embodiment of the present disclosure.

As shown in FIG. 3, in the first embodiment, the pins may be divided into two groups. A first group of pins consists of the pins 200a arranged at the centers of the sub-regions, and a second group of pins consists of the pins 200c arranged at the corners of the sub-regions. The substrate is supported by the first group of pins and the second group of pins alternately, so an equal force may be applied to the substrate at the contact positions and the substrate may be supported in a better manner. In addition, due to a large number of pins, it is able to reduce the weight withstood by each pin.

As shown in FIG. 4, in the second embodiment, the pins may be divided into two groups. A first group of pins consists of the pins 200a arranged at the centers of the sub-regions, and a second group of pins consists of the pins 200b arranged at the centers of the sides of the sub-regions and the pins 200c arranged at the corners of the sub-regions. The substrate is supported by the first group of pins and the second group of pins alternately, so an equal force may be applied to the substrate at the contact positions and the substrate may be supported in a better manner. In addition, due to a large number of pins, it is able to reduce the weight withstood by each pin.

It should be appreciated that, during the actual application, the positions for each group of pins may not be limited to those mentioned hereinbefore.

It should be further appreciated that, the substrate support structure may be applied to a vacuum drying device, so as to support the substrate during the vacuum drying process. Of course, the substrate support structure may also be applied to any other scenarios where a substrate needs to be supported.

The present disclosure further provides in some embodiments a vacuum drying device, which includes the above-mentioned substrate support structure, and a control mechanism configured to enable at least two groups of pins in the substrate support structure to be lifted alternately so that the substrate is supported by the at least two groups of pins alternately.

According to the embodiments of the present disclosure, when the substrate is subjected to the vacuum drying treatment using the vacuum drying device, the at least two groups of pins are lifted alternately under the control of the control mechanism, so as to support the substrate alternately, thereby to prevent the occurrence of Mura at the positions where the substrate is in contact with the pins. In addition, in the case that the substrate is supported by the at least two groups of pins alternately, it is able to prevent the substrate from being curved at a fixed degree for a long period of time, thereby to prevent the coating liquid from being coated unevenly due to the gravity and prevent the occurrence of uneven thickness of the coating liquid.

Optionally, the control mechanism includes a first control module configured to enable the at least two groups of pins to be lifted alternately at a first frequency within a first time period, and a second control module configured to enable the at least two groups of pins to be lifted alternately at a second frequency less than the first frequency within a second time period subsequent to the first time period.

In the embodiments of the present disclosure, the at least two groups of pins may be lifted alternately in a time-division manner. At the beginning of the vacuum drying treatment, the coating liquid may flow quickly on the substrate, so the at least two groups of pins need to be lifted alternately at a high frequency. In the case that the coating liquid is partially solidified on the substrate, the at least two groups of pins may be lifted alternately at a low frequency, so as to evenly coat the coating liquid onto the substrate.

It should be appreciated that, during the actual application, the frequencies at which the at least two groups of pins are lifted are not particularly defined herein, and they may be set in accordance with a material and a thickness of the coating liquid.

In addition, it should be further appreciated that, the vacuum drying device in the embodiments of the present disclosure may be heated in an atmosphere, and it may further include a heating unit. Optionally, the heating unit includes an upper heating plate and a lower heating plate arranged at an upper side and a lower side of the support platform 100. In this way, it is able to control a temperature in a cavity of the vacuum drying device conveniently.

It should be further appreciated that, during the actual application, in the case that the at least two groups of pins are lifted alternately to support the substrate, one group of the at least two groups of pins does not necessarily move downwardly to the bottom each time, and instead, the one group of the at least two groups of pins merely need to be separated from the substrate.

The present disclosure further provides in some embodiments a method for vacuum drying a substrate using the above-mentioned vacuum drying device, including steps of: placing the substrate on at least two groups of pins, and during a vacuum drying procedure, enabling the at least two groups of pins to be lifted alternately, so as to support the substrate alternately.

In the embodiments of the present disclosure, in the case that the substrate is subjected to the vacuum drying treatment using the vacuum drying device, the at least two groups of pins are lifted alternately under the control of the control mechanism, so as to support the substrate alternately, thereby to prevent the occurrence of Mura at the positions where the substrate is in contact with the pins. In addition, in the case that the substrate is supported by the at least two groups of pins alternately, it is able to prevent the substrate from being curved at a fixed degree for a long period of time, thereby to prevent the coating liquid from being coated unevenly due to the gravity and prevent the occurrence of uneven thickness of the coating liquid.

Further, the step of enabling the at least two groups of pins to be lifted alternately includes: enabling the at least two groups of pins to be lifted alternately at a first frequency within a first time period, and enabling the at least two groups of pins to be lifted alternately at a second frequency less than the first frequency within a second time period subsequent to the first time period.

In the embodiments of the present disclosure, the at least two groups of pins may be lifted alternately in a time-division manner. At the beginning of the vacuum drying treatment, the coating liquid may flow quickly on the substrate, so the at least two groups of pins need to be lifted alternately at a high frequency. In the case that the coating liquid is partially solidified on the substrate, the at least two groups of pins may be lifted alternately at a low frequency, so as to evenly coat the coating liquid onto the substrate. It should be appreciated that, viscosity of the coating liquid coated onto the substrate shall not be too low.

It should be appreciated that, during the actual application, the frequencies at which the at least two groups of pins are lifted are not particularly defined herein, and they may be set in accordance with a material and a thickness of the coating liquid.

The above are merely the optional embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A substrate support structure, comprising: a support platform and a plurality of pins in the support platform; wherein the plurality of pins is divided into at least two groups, and the at least two groups of pins are in the support platform in such a manner as to be liftable in the support platform, so that a substrate is supported by the at least two groups of pins alternately.

2. The substrate support structure according to claim 1, wherein a region of the support platform exactly facing the substrate is equally divided into a plurality of sub-regions arranged in a matrix form, and each group of pins comprises at least one pin at each sub-region.

3. The substrate support structure according to claim 2, wherein one of the pins is arranged at a center of each sub-region, and one group of the at least two groups of pins comprises the pin arranged at the center of each sub-region.

4. The substrate support structure according to claim 3, wherein at least one of the pins is arranged at a border between each sub-region and an adjacent sub-region, and the other group of the at least two groups of pins comprises the pin arranged at the border between each sub-region and the adjacent sub-region.

5. The substrate support structure according to claim 4, wherein each sub-region is of a rectangular shape, one of the pins is arranged at at least one corner of each sub-region, and the other group of the at least two groups of pins comprises the pin arranged at at least one corner of each sub-region.

6. The substrate support structure according to claim 5, wherein one of the pins is arranged at each corner of each sub-region, and the other group of the at least two groups of pins comprises the pin arranged at each corner of each sub-region.

7. The substrate support structure according to claim 4, wherein each sub-region is of a rectangular shape, one of the pins is arranged at a center of each side of each sub-region, and the other group of the at least two groups of pins comprises the pin arranged at the center of each side of each sub-region.

8. The substrate support structure according to claim 2, wherein at least one pin is arranged at a border between each sub-region and an adjacent sub-region, and one group of the at least two groups of pins comprises the pin arranged at the border between each sub-region and the adjacent sub-region.

9. The substrate support structure according to claim 8, wherein each sub-region is of a rectangular shape, one of the pins is arranged at at least one corner of each sub-region, and one group of the at least two groups of pins comprises the pin arranged at at least one corner of each sub-region.

10. The substrate support structure according to claim 9, wherein one of the pins is arranged at each corner of each sub-region, and one group of the at least two groups of pins comprises the pin arranged at each corner of each sub-region.

11. The substrate support structure according to claim 2, wherein each sub-region is of a rectangular shape, one of the pins is arranged at at least one corner of each sub-region, one of the pins is arranged at a center of each side of each sub-region, one group of the at least two groups of pins comprises the pin arranged at at least one corner of each sub-region, and the other group of the at least two groups of pins comprises the pin arranged at the center of each side of each sub-region.

12. A vacuum drying device, comprising a substrate support structure and a control mechanism;
wherein the substrate support structure comprises a support platform and a plurality of pins in the support platform, the plurality of pins is divided into at least two groups, and the at least two groups of pins are in the support platform in such a manner as to be liftable on the support platform, and
the control mechanism is configured to enable at least two groups of pins in the substrate support structure to be lifted alternately so that a substrate is supported by the at least two groups of pins alternately.

13. The vacuum drying device according to claim 12, wherein the control mechanism comprises:
a first control module configured to enable the at least two groups of pins to be lifted alternately at a first frequency within a first time period; and
a second control module configured to enable the at least two groups of pins to be lifted alternately at a second frequency less than the first frequency within a second time period subsequent to the first time period.

14. The vacuum drying device according to claim 12, wherein a region of the support platform exactly facing the substrate is equally divided into a plurality of sub-regions arranged in a matrix form, and each group of pins comprises at least one pin at each sub-region.

15. The vacuum drying device according to claim 14, wherein one of the pins is arranged at a center of each sub-region, and one group of the at least two groups of pins comprises the pin arranged at the center of each sub-region.

16. The vacuum drying device according to claim 15, wherein at least one of the pins is arranged at a border between each sub-region and an adjacent sub-region, and the other group of the at least two groups of pins comprises the pin arranged at the border between each sub-region and the adjacent sub-region.

17. The vacuum drying device according to claim 16, wherein each sub-region is of a rectangular shape, one of the pins is arranged at at least one corner of each sub-region, and the other group of the at least two groups of pins comprises the pin arranged at at least one corner of each sub-region.

18. The vacuum drying device according to claim 14, wherein each sub-region is of a rectangular shape, one of the pins is arranged at at least one corner of each sub-region, one of the pins is arranged at a center of each side of each sub-region, one group of the at least two groups of pins comprises the pin arranged at at least one corner of each sub-region, and the other group of the at least two groups of pins comprises the pin arranged at the center of each side of each sub-region.

19. A method for vacuum drying a substrate using the vacuum drying device according to claim 12, comprising steps of:
- placing the substrate on at least two groups of pins; and
- during a vacuum drying procedure, enabling the at least two groups of pins to be lifted alternately, so as to support the substrate alternately.

20. The vacuum drying method according to claim 19, wherein the step of enabling the at least two groups of pins to be lifted alternately comprises:
- enabling the at least two groups of pins to be lifted alternately at a first frequency within a first time period; and
- enabling the at least two groups of pins to be lifted alternately at a second frequency less than the first frequency within a second time period subsequent to the first time period.

* * * * *